(12) United States Patent
Chen

(10) Patent No.: US 8,680,480 B2
(45) Date of Patent: Mar. 25, 2014

(54) BEAM CONTROL ASSEMBLY FOR RIBBON BEAM OF IONS FOR ION IMPLANTATION

(71) Applicant: Advanced Ion Beam Technology, Inc., Fremont, CA (US)

(72) Inventor: Jiong Chen, San Jose, CA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 0 days.

(21) Appl. No.: 13/889,278

(22) Filed: May 7, 2013

(65) Prior Publication Data

US 2013/0239892 A1 Sep. 19, 2013

Related U.S. Application Data

(63) Continuation of application No. 12/957,294, filed on Nov. 30, 2010, now Pat. No. 8,502,160, which is a continuation of application No. 12/053,076, filed on Mar. 21, 2008, now Pat. No. 7,851,767.

(60) Provisional application No. 60/919,365, filed on Mar. 21, 2007.

(51) Int. Cl.
 *G21K 1/08* (2006.01)
(52) U.S. Cl.
 USPC .............. 250/396 R; 250/398; 250/396 ML
(58) Field of Classification Search
 None
 See application file for complete search history.

(56) References Cited

U.S. PATENT DOCUMENTS

| | | | | | |
|---|---|---|---|---|---|
| 1,201,220 | A | * | 10/1916 | Coulombe | 261/48 |
| 1,331,018 | A | * | 2/1920 | Luthy | 429/143 |
| 2,720,087 | A | * | 10/1955 | Groene | 62/230 |
| 4,712,042 | A | * | 12/1987 | Hamm | 315/5.41 |
| 5,523,658 | A | * | 6/1996 | Fukuma et al. | 315/368.19 |
| 5,717,371 | A | * | 2/1998 | Crow | 335/216 |
| 5,834,786 | A | * | 11/1998 | White et al. | 250/492.21 |
| 6,423,976 | B1 | * | 7/2002 | Glavish et al. | 250/492.21 |
| 6,423,978 | B1 | * | 7/2002 | Furuta et al. | 250/559.36 |
| 6,933,507 | B2 | * | 8/2005 | Purser et al. | 250/396 ML |
| 6,933,607 | B2 | * | 8/2005 | Ono et al. | 257/737 |
| 7,078,713 | B2 | * | 7/2006 | White | 250/492.21 |
| 7,105,839 | B2 | * | 9/2006 | White | 250/492.21 |
| 7,301,156 | B2 | * | 11/2007 | Purser et al. | 250/396 ML |

(Continued)

OTHER PUBLICATIONS

Non Final Office Action received for U.S. Appl. No. 12/053,076, mailed on Jan. 29, 2010, 11 pages.

(Continued)

*Primary Examiner* — Andrew Smyth
(74) *Attorney, Agent, or Firm* — Morrison & Foerster LLP

(57) ABSTRACT

A beam control assembly to shape a ribbon beam of ions for ion implantation includes a first bar, second bar, first coil of windings of electrical wire, second coil of windings of electrical wire, first electrical power supply, and second electrical power supply. The first coil is disposed on the first bar. The first coil is the only coil disposed on the first bar. The second bar is disposed opposite the first bar with a gap defined between the first and second bars. The ribbon beam travels between the gap. The second coil is disposed on the second bar. The second coil is the only coil disposed on the second bar. The first electrical power supply is connected to the first coil without being electrically connected to any other coil. The second electrical power supply is connected to the second coil without being electrically connected to any other coil.

16 Claims, 6 Drawing Sheets

(56) References Cited

U.S. PATENT DOCUMENTS

| | | | |
|---|---|---|---|
| 7,326,941 B2 * | 2/2008 | Chen et al. | 250/492.21 |
| 7,328,941 B2 * | 2/2008 | Asbach et al. | 297/153 |
| 7,462,843 B2 * | 12/2008 | Chen et al. | 250/492.21 |
| 7,525,103 B2 * | 4/2009 | Purser et al. | 250/396 ML |
| 7,807,983 B2 * | 10/2010 | Purser et al. | 250/492.21 |
| 2003/0205683 A1 * | 11/2003 | Benveniste | 250/492.21 |
| 2004/0097058 A1 * | 5/2004 | Purser et al. | 438/514 |
| 2005/0017202 A1 * | 1/2005 | White | 250/492.21 |
| 2005/0082498 A1 * | 4/2005 | White | 250/492.21 |
| 2005/0242294 A1 * | 11/2005 | Purser et al. | 250/396 ML |
| 2005/0258380 A1 * | 11/2005 | White et al. | 250/492.21 |
| 2006/0113494 A1 * | 6/2006 | Chen et al. | 250/492.21 |
| 2006/0113495 A1 * | 6/2006 | Chen et al. | 250/492.21 |
| 2007/0170369 A1 * | 7/2007 | Purser et al. | 250/396 ML |
| 2008/0135775 A1 * | 6/2008 | Smatlak et al. | 250/396 ML |
| 2008/0169426 A1 * | 7/2008 | Purser et al. | 250/396 ML |

OTHER PUBLICATIONS

Notice of Allowance received for U.S. Appl. No. 12/053,076, mailed on Aug. 6, 2010, 7 pages.

Non Final Office Action received for U.S. Appl. No. 12/957,294 mailed on Jun. 1, 2012, 20 pages.

Notice of Allowance received for U.S. Appl. No. 12/957,294, mailed on Jan. 14, 2013, 22 pages.

International Search Report and Written Opinion received for PCT Patent Application No. PCT/US2008/057929, mailed on Aug. 27, 2008, 7 pages.

International Preliminary Report on Patentability received for PCT Patent Application No. PCT/US2008/057929, issued on Sep. 22, 2009, 7 pages.

* cited by examiner

BEAM CONTROL ASSEMBLY FOR RIBBON BEAM OF IONS FOR ION IMPLANTATION

CROSS REFERENCE TO RELATED APPLICATIONS

The present application is a Continuation application of U.S. patent application Ser. No. 12/957,294, filed Nov. 30, 2010, which is a Continuation of U.S. patent application Ser. No. 12/053,076, filed Mar. 21, 2008, which issued as U.S. Pat. No. 7,851,767 on Dec. 14, 2010, which claims priority to U.S. Provisional Application Ser. No. 60/919,365, filed Mar. 21, 2007.

BACKGROUND

1. Field

The present application generally relates to ion implanters, and, more particularly, to a beam control assembly to shape a ribbon beam of ions for ion implantation.

2. Related Art

Figure 1:
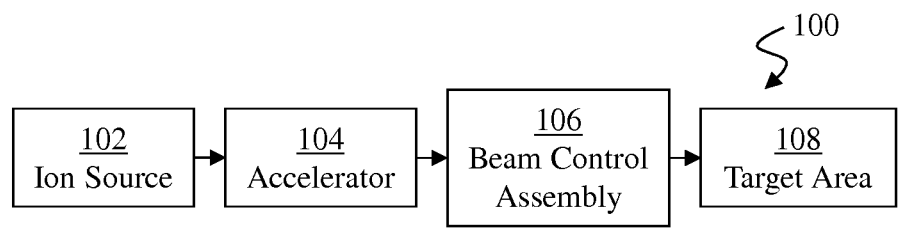

Ion implanters are used to implant ions in various applications, including semiconductor device fabrication. As depicted in FIG. 1, an ion implanter 100 typically includes an ion source 102 configured to generate the ions, an accelerator 104 configured to accelerate the ions to a desired energy, a beam control assembly 106 configured to shape the ions into a desired pattern, and a target area 108 configured to position the work piece, such as a wafer in semiconductor device fabrication, for ion implantation.

Figure 2A:
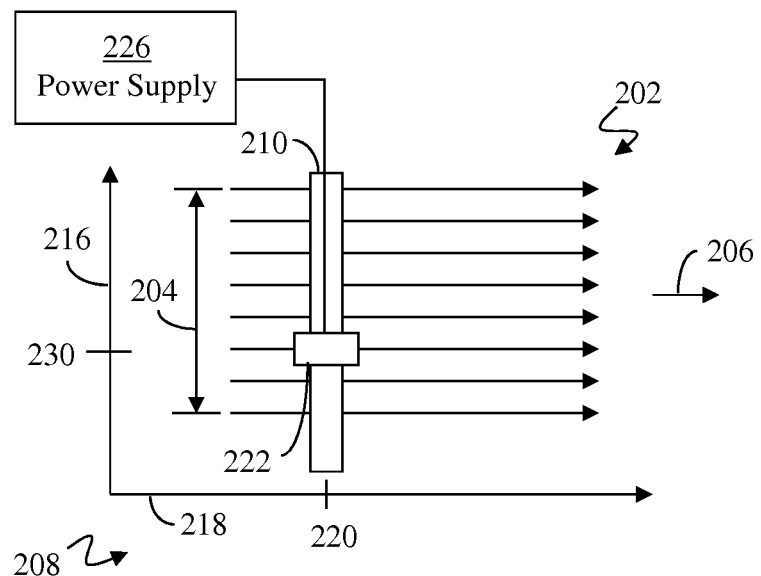

To increase throughput, particularly in semiconductor applications, a ribbon beam of ions is used. In particular, with reference to FIG. 2A, a ribbon beam 202 can be generated and used to implant ion in an area of a work piece, such as a wafer in semiconductor applications. As depicted in FIG. 2A, ribbon beam 202 has a beam width 204 and travels in a beam direction 206.

Various conventional devices and techniques exist for controlling ribbon beam 202. For example, see, U.S. Pat. No. 7,078,713, issued Jul. 18, 2006, and U.S. Pat. No. 6,933,607, issued Aug. 23, 2005, which are incorporated herein by reference in their entireties for all purposes. These conventional devices and techniques have various shortcomings in shaping a ribbon beam of ions for ion implantation.

SUMMARY

In one exemplary embodiment, a beam control assembly to shape a ribbon beam of ions for ion implantation includes a first bar, second bar, first coil of windings of electrical wire, second coil of windings of electrical wire, first electrical power supply, and second electrical power supply. The first coil is disposed on the first bar. The first coil is the only coil disposed on the first bar. The second bar is disposed opposite the first bar with a gap defined between the first and second bars. The ribbon beam travels between the gap. The second coil is disposed on the second bar. The second coil is the only coil disposed on the second bar. The first electrical power supply is connected to the first coil without being electrically connected to any other coil. The second electrical power supply is connected to the second coil without being electrically connected to any other coil.

DESCRIPTION OF DRAWING FIGURES

Figure 2B:
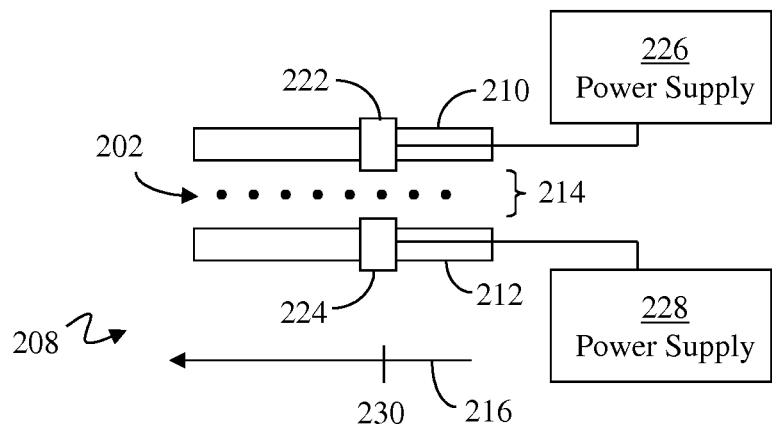
Figure 2C:
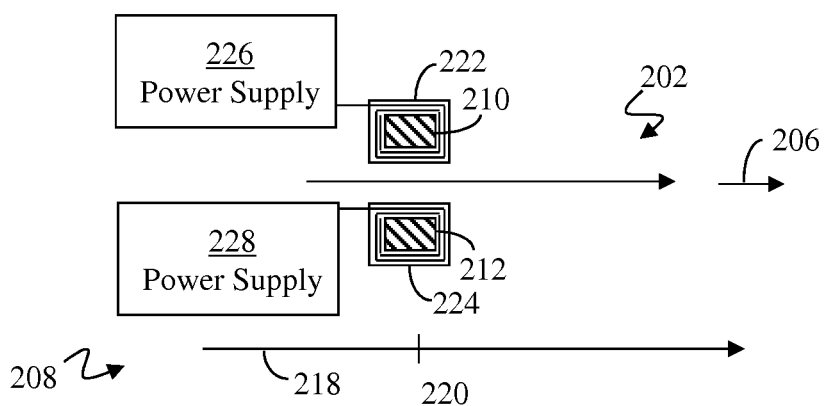
Figure 3A:
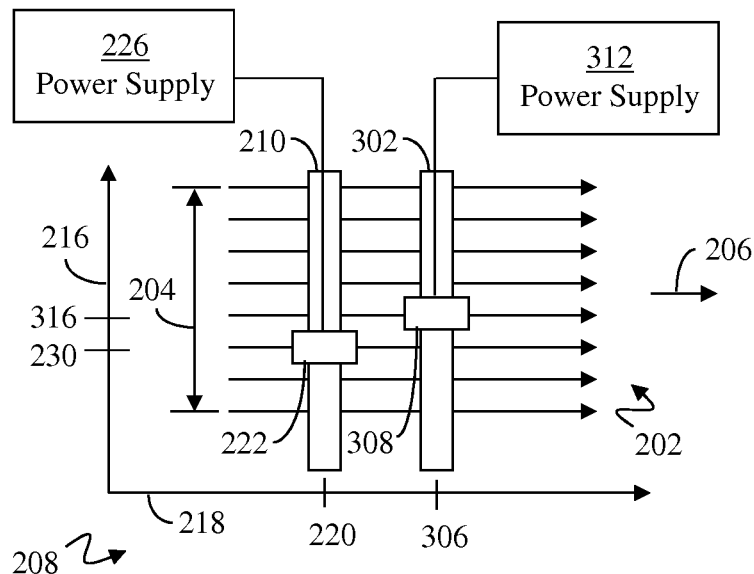
Figure 3B:
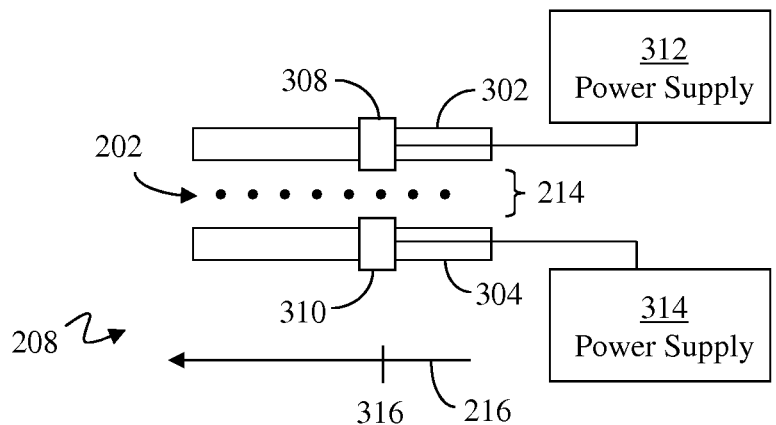
Figure 3C:
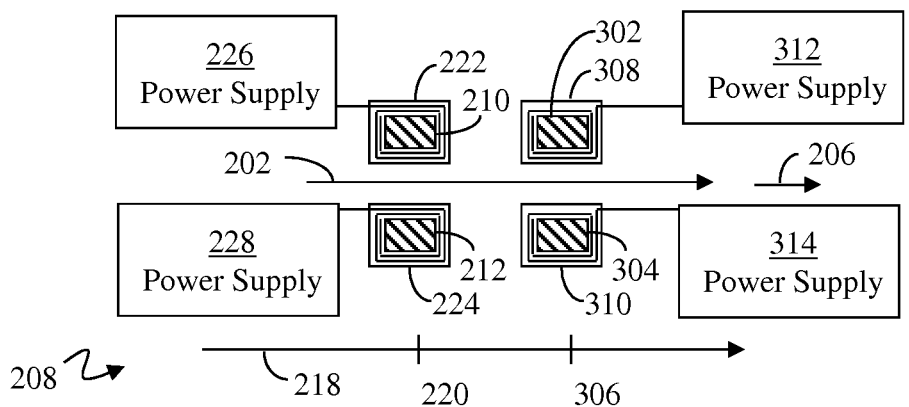
Figure 9:
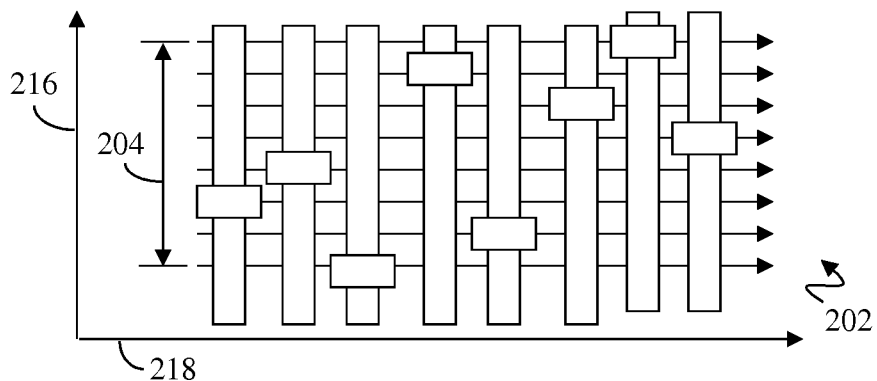
Figure 10:
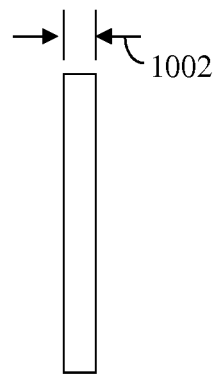

The present application can be best understood by reference to the following description taken in conjunction with the accompanying drawing figures, in which like parts may be referred to by like numerals:

FIG. 1 depicts an ion implanter;
FIG. 2A depicts a ribbon beam of ions;
FIGS. 2B and 2C depict an exemplary beam control assembly;
FIGS. 3A-3C depict another exemplary beam control assembly;
FIGS. 4-9 depict various exemplary beam control assemblies; and
FIG. 10 depicts an exemplary bar that can be used in an exemplary beam control assembly.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

With reference to FIG. 2B, in one exemplary embodiment, a beam control assembly 208 to shape a ribbon beam of ions for ion implantation includes a first bar 210 and a second bar 212. Second bar 212 is disposed opposite first bar 210 to define a gap 214 between second bar 212 and first bar 210. The ribbon beam travels between gap 214.

As depicted in FIG. 2A, a first dimension 216 within beam control assembly 208 corresponds to beam width 204. As also depicted in FIG. 2A, a second dimension 218 within beam control assembly 208 corresponds to beam direction 206.

Figure 4:
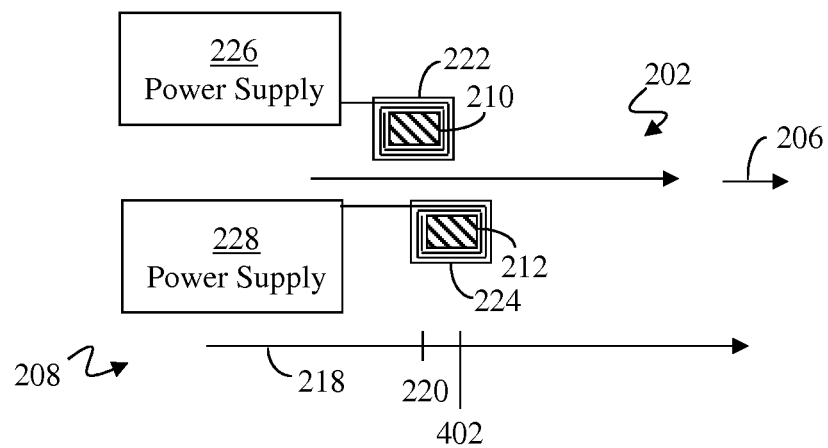

In one exemplary embodiment, first bar 210 is located at a first position 220 in second dimension 218 and extends into first dimension 216. In this exemplary embodiment, as depicted in FIGS. 2B and 2C, second bar 212 is also located at first position 220 in second dimension 218 and extends into first dimension 216. Alternatively, as depicted in FIG. 4, second bar 212 can be located at a second position 402 in second dimension 218, which is different than first position 220.

With reference to FIG. 2A, beam control assembly 208 includes a first coil 222 disposed on first bar 210. In the present exemplary embodiment, first coil 222 is the only coil disposed on first bar 210. First coil 222 includes windings of electrical wire. As depicted in FIG. 2C, the windings of first coil 222 are concentric to first bar 210, which corresponds to being wound around first dimension 216 (FIG. 2A).

With reference again to FIG. 2B, beam control assembly 208 includes a second coil 224 disposed on second bar 212. In the present exemplary embodiment, second coil 224 is the only coil disposed on second bar 212. Second coil 224 includes windings of electrical wire. As depicted in FIG. 2C, the windings of second coil 224 are concentric to second bar 212, which corresponds to being wound around first dimension 216 (FIG. 2A).

With reference again to FIG. 2B, beam control assembly 208 includes a first electrical power supply 226 electrically connected to first coil 222 without being electrically connected to any other coil. Beam control 208 also includes a second electrical power supply 228 electrically connected to second coil 224 without being electrically connected to any other coil.

With reference to FIG. 2B, in one exemplary embodiment, first coil 222 is fixed to first position 230 in first dimension 216 on first bar 210. In this exemplary embodiment, second coil 224 is also fixed to first position 230 in first dimension 216 on second bar 212. Second coil 224 is located opposite first coil 222 at first position 230 in first dimension 216. Thus, the portion of ribbon beam 202 adjacent to first position 230 in first dimension 216 can be controlled from both sides of gap 214 using first coil 222 and first electrical power supply 226 and/or second coil 224 and second electrical power supply 228.

Figure 5:
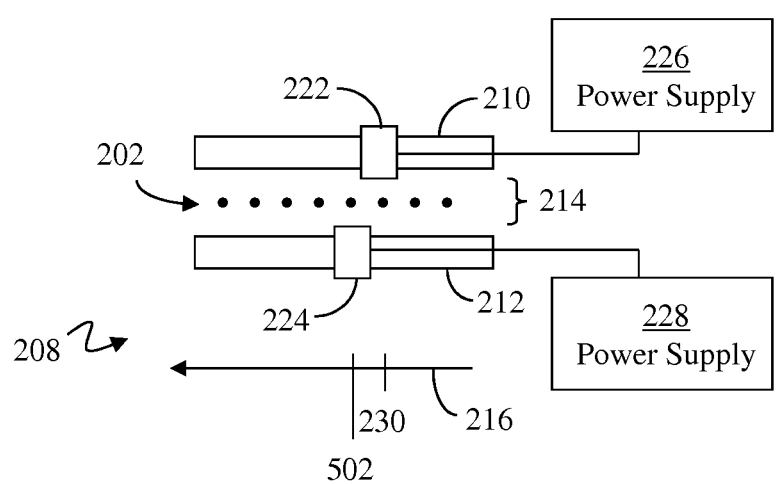

With reference to FIG. 5, in another exemplary embodiment, second coil 224 can be fixed to a second position 502 in first dimension 216 on second bar 212. In this exemplary embodiment, one portion of ribbon beam 202 adjacent to first position 230 in first dimension 216 can be controlled from one side of gap 214 using first coil 222 and first electrical power supply 226, and another portion of ribbon beam 202 adjacent to second position 502 can be controlled from another side of gap 214 using second coil 224 and second electrical power supply 228.

With reference to FIG. 2B, in another exemplary embodiment, first coil 222 is configured to move along first bar 210 to be located at different positions in first dimension 216. Second coil 224 is configured to move along second bar 212 to be located at different positions in first dimension 216. Although not depicted, it should be recognized that first coil 222 and second coil 224 can be moved using various devices, including actuators, tracks, and the like.

With reference to FIG. 3B, in on exemplary embodiment, beam control assembly 208 includes a third bar 302 and a fourth bar 304. Fourth bar 304 is disposed opposite third bar 302 with gap 214 defined between fourth bar 304 and third bar 302. The ribbon beam travels between gap 214.

Figure 6:
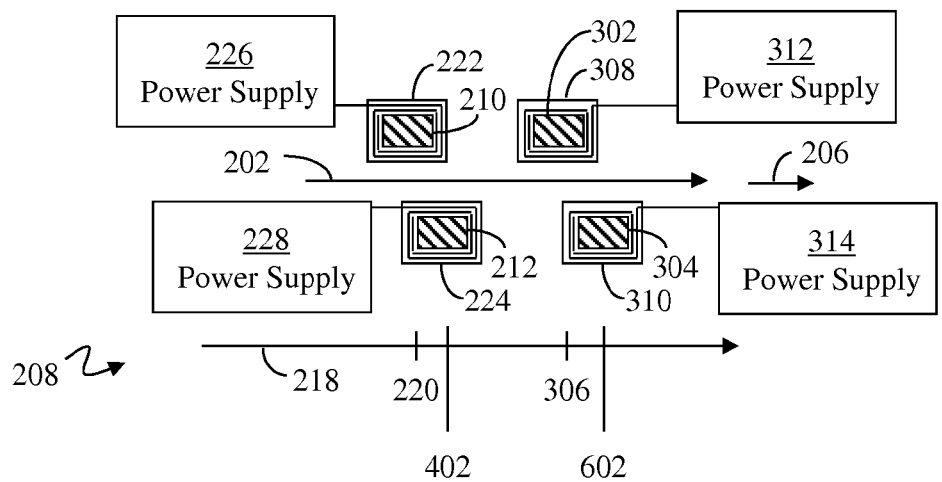

As depicted in FIGS. 3A and 3C, third bar 302 is adjacent first bar 210. Third bar 302 is located at a third position 306 in second dimension 218 and extends into first dimension 216. In one exemplary embodiment, as depicted in FIGS. 3B and 3C, fourth bar 304 is located at third position 306 in second dimension 218 and extends into first dimension 216. Alternatively, as depicted in FIG. 6, fourth bar 304 can be located at fourth position 602 in second dimension 218.

With reference to FIG. 3A, beam control assembly 208 also includes a third coil 308 disposed on third bar 302. In the present exemplary embodiment, third coil 308 is the only coil disposed on third bar 302. Third coil 308 includes windings of electrical wire. As depicted in FIG. 3C, the windings of third coil 308 are concentric to third bar 302, which corresponds to being wound around first dimension 216 (FIG. 3A).

Beam control assembly 208 includes a fourth coil 310 disposed on fourth bar 304. In the present exemplary embodiment, fourth coil 310 is the only coil disposed on fourth bar 304. Fourth coil 310 includes windings of electrical wire. The windings of fourth coil 310 are concentric to fourth bar 304, which corresponds to being wound around first dimension 216 (FIG. 2A).

Beam control assembly 208 includes a third electrical power supply 312 electrically connected to third coil 308 without being electrically connected to any other coil. Beam control 208 also includes a fourth electrical power supply 314 electrically connected to fourth coil 310 without being electrically connected to any other coil.

With reference to FIG. 3B, in one exemplary embodiment, third coil 308 is fixed to a third position 316 in first dimension 216 on third bar 302. In this exemplary embodiment, fourth coil 310 is also fixed to third position 316 in first dimension 216 on fourth bar 304. Fourth coil 310 is located opposite third coil 308 at third position 316 in first dimension 216. Thus, the portion of ribbon beam 202 adjacent to third position 316 in first dimension 216 can be controlled from both sides of gap 214 using third coil 308 and third electrical power supply 312 and/or fourth coil 310 and fourth electrical power supply 314.

Figure 7:
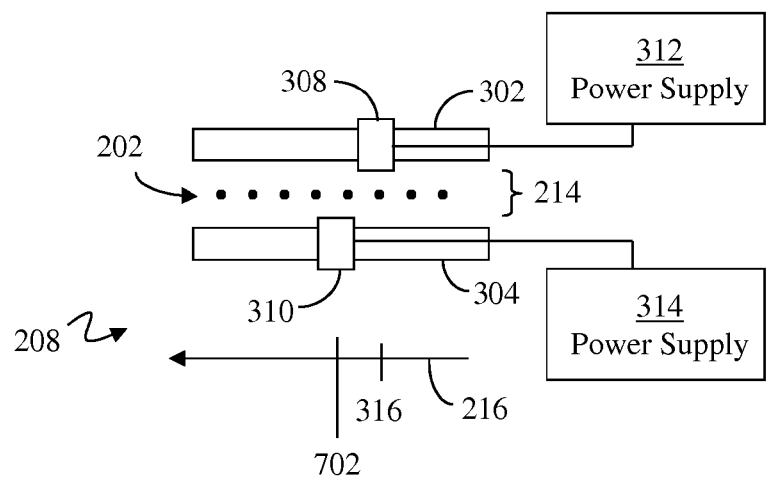

With reference to FIG. 7, in another exemplary embodiment, fourth coil 310 can be fixed to a fourth position 702 in first dimension 216 on fourth bar 304. In this exemplary embodiment, one portion of ribbon beam 202 adjacent to third position 316 in first dimension 216 can be controlled from one side of gap 214 using third coil 308 and third electrical power supply 312, and another portion of ribbon beam 202 adjacent to fourth position 702 can be controlled from another side of gap 214 using fourth coil 310 and second electrical power supply 314.

With reference to FIG. 3B, in another exemplary embodiment, third coil 308 is configured to move along third bar 302 to be located at different positions in first dimension 216. Fourth coil 310 is configured to move along fourth bar 304 to be located at different positions in first dimension 216. Although not depicted, it should be recognized that third coil 308 and fourth coil 310 can be moved using various devices, including actuators, tracks, and the like.

In the exemplary embodiment depicted in FIG. 3A, first bar 210 and third bar 302 are depicted as extending in first dimension 216 across the entire beam width 204 of ribbon beam 202. As depicted in FIGS. 2B and 3B, second bar 212 and fourth bar 304 also extend in first dimension 216 across the entire beam width 204. Additionally, in this exemplary embodiment, first bar 210, second bar 212, third bar 302, and fourth bar 304 all extend from the same side of beam control assembly 208. One advantage to this exemplary embodiment is that supply lines, including electrical lines, can be supplied from the same side.

Figure 8:
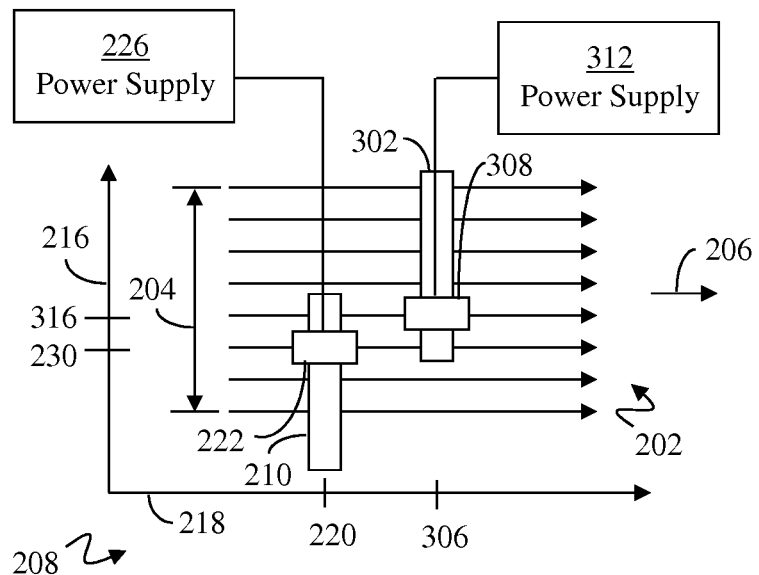

With reference to FIG. 8, in another exemplary embodiment, first bar 210 and third bar 302 extend in first dimension 216 across only a portion of beam width 204 of ribbon beam 202. Although not depicted, it should be recognized that second bar 212 and fourth bar 304 also extend in first dimension 216 across only a portion of beam width 204 of ribbon beam 202. As depicted in FIG. 8, in this exemplary embodiment, first bar 210 and third bar 302 can extend from opposite sides of beam control assembly 208. Similarly, second bar 212 and fourth bar 304 can also extend from opposite sides of beam control assembly 208.

With reference to FIGS. 3A and 8, when first coil 222 and third coil 308 are fixed to first position 230 and third position 316, respectively, on first bar 210 and third bar 302, respectively, first coil 222 and third coil 308 can be positioned such that the portion of ribbon beam 202 adjacent to first coil 222 overlaps with the portion of ribbon beam 202 adjacent to third coil 308. In a similar manner, second coil 224 and fourth coil 310 can be positioned such that the portion of ribbon beam 202 adjacent to second coil 224 overlaps with the portion of ribbon beam 202 adjacent to fourth coil 310.

It should be recognized that beam control assembly 208 can include any number of bars located at different positions along second dimension 218, each bar having only one coil disposed on the bar, with the coils of the different bars located at different positions along first dimension 216. For example, FIG. 9 depicts 8 bars located at 8 different positions along second dimension 218, each bar having only one coil disposed on the bar, with the 8 coils of the 8 different bars located at 8 different positions along first dimension 216 such that the entire beam width 204 of ribbon beam 202 can be controlled separately by the coils.

With reference to FIG. 10, in one exemplary embodiment, the bars described above (such as first bar 210 in FIG. 2) are steel bars. As depicted in FIG. 10, the bars can have a greatest width 1002 of about 50 to 100 mm. It should be recognized, however, that the bars can be made of various types of materials, and have various dimensions.

Also, the coils described above (such as first coil 222 in FIG. 2A) were described as being windings of electrical wire.

In one exemplary embodiment, the coils are copper wires. It should be recognized, however, that the coils can be made of various types of electrically conductive material.

Although exemplary embodiments have been described, various modifications can be made without departing from the spirit and/or scope of the present invention. Therefore, the present invention should not be construed as being limited to the specific forms shown in the drawings and described above.

I claim:

1. A beam control assembly to shape a ribbon beam of ions for ion implantation, the beam control assembly comprising:
    a first bar, wherein the ribbon beam has a beam width and travels in a beam direction, wherein a first dimension corresponds to the beam width and a second dimension corresponds to the beam direction of the ribbon beam, and wherein the first bar is located at a first position in the second dimension and extends into the first dimension;
    a first coil disposed on the first bar, wherein the first coil is the only coil disposed on the first bar, and wherein the first coil includes windings of electrical wire;
    a second bar disposed opposite the first bar with a gap defined between the first bar and second bar, wherein the ribbon beam travels between the gap, and wherein the second bar is located at a second position in the second dimension and extends into the first dimension;
    a second coil disposed on the second bar, wherein the second coil is the only coil disposed on the second bar, and wherein the second coil includes windings of electrical wire;
    a third bar adjacent to the first bar, wherein the third bar is located at a third position in the second dimension and extends into the first dimension, and wherein the first position, the second position, and the third position are different;
    a third coil disposed on the third bar, wherein the third coil is the only coil disposed on the third bar, wherein the third coil includes windings of electrical wire;
    a fourth bar adjacent to the second bar;
    a fourth coil disposed on the fourth bar, wherein the fourth coil is the only coil disposed on the fourth bar, wherein the fourth coil includes windings of electrical wire;
    a first electrical power supply connected to the first coil without being electrically connected to any other coil;
    a second electrical power supply connected to the second coil without being electrically connected to any other coil;
    a third electrical power supply connected to the third coil without being electrically connected to any other coil; and
    a fourth electrical power supply connected to the fourth coil without being electrically connected to any other coil.

2. The beam control assembly of claim 1, wherein the first coil is configured to move along the first bar to be located at different positions in the first dimension on the first bar, and wherein the second coil is configured to move along the second bar to be located at different positions in the first dimension on the second bar.

3. The beam control assembly of claim 1, wherein the first coil is fixed to a first position in the first dimension on the first bar, and wherein the second coil is fixed to the first position in the first dimension on the second bar.

4. The beam control assembly of claim 1, wherein the first coil is fixed to a first position in the first dimension on the first bar, and wherein the second coil is fixed to a second position in the first dimension on the second bar, and wherein the first and second positions are different.

5. The beam control assembly of claim 1, wherein the fourth bar is located at a fourth position in the second dimension and extends into the first dimension, and wherein the first, second, third, and fourth positions are different.

6. The beam control assembly of claim 1, wherein the third coil is configured to move along the third bar to be located at different positions in the first dimension on the third bar, and wherein the fourth coil is configured to move along the fourth bar to be located at different positions in the first dimension on the fourth bar.

7. The beam control assembly of claim 1, wherein the third coil is fixed to a third position in the first dimension on the third bar, and wherein the fourth coil is fixed to the third position in the first dimension on the fourth bar.

8. The beam control assembly of claim 1, wherein the third coil is fixed to a third position in the first dimension on the third bar, and wherein the fourth coil is fixed to a fourth position in the first dimension on the fourth bar, and wherein the third and fourth positions are different.

9. The beam control assembly of claim 1, wherein the first, second, third, and fourth bars extend in the first dimension across the entire beam width.

10. The beam control assembly of claim 9, wherein the first, second, third and fourth bars extend from one side of the beam control assembly.

11. The beam control assembly of claim 1, wherein the first, second, third, and fourth bars extend in the first dimension across a portion of the beam width.

12. The beam control assembly of claim 11, wherein the first and second bars extend from one side of the beam control assembly, and wherein the third and fourth bars extend from an opposite side of the beam control assembly as the first and second bars.

13. The beam control assembly of claim 1, wherein a portion of the ribbon beam adjacent to the first coil overlaps with a portion of the ribbon beam adjacent to the third coil.

14. A beam control assembly to shape a ribbon beam of ions for ion implantation, the beam control assembly comprising:
    a first bar, wherein the ribbon beam has a beam width and travels in a beam direction, wherein a first dimension corresponds to the beam width and a second dimension corresponds to the beam direction of the ribbon beam, and wherein the first bar is located at a first position in the second dimension and extends into the first dimension;
    a first coil disposed on the first bar, wherein the first coil is the only coil disposed on the first bar, and wherein the first coil includes windings of electrical wire;
    a second bar disposed opposite the first bar with a gap defined between the first bar and second bar, wherein the ribbon beam travels between the gap;
    a second coil disposed on the second bar, wherein the second coil is the only coil disposed on the second bar, and wherein the second coil includes windings of electrical wire;
    a third bar adjacent to the first bar, wherein the third bar is located at a third position in the second dimension and extends into the first dimension;
    a third coil disposed on the third bar, wherein the third coil is the only coil disposed on the third bar, wherein the third coil includes windings of electrical wire;
    a fourth bar adjacent to the second bar, wherein the fourth bar is located at a fourth position in the second dimension and extends into the first dimension, and wherein the first position, the third position, and the fourth position are different;

a fourth coil disposed on the fourth bar, wherein the fourth coil is the only coil disposed on the fourth bar, wherein the fourth coil includes windings of electrical wire;

a first electrical power supply connected to the first coil without being electrically connected to any other coil;

a second electrical power supply connected to the second coil without being electrically connected to any other coil;

a third electrical power supply connected to the third coil without being electrically connected to any other coil; and a fourth electrical power supply connected to the fourth coil without being electrically connected to any other coil.

15. An ion implanter to implant ions using a ribbon beam of ions, comprising:

an ion source;

an accelerator configured to accelerate the ion disposed adjacent to the ion source;

a beam control assembly disposed adjacent to the accelerator, the beam control assembly comprising:

a first bar, wherein the ribbon beam has a beam width and travels in a beam direction, wherein a first dimension corresponds to the beam width and a second dimension corresponds to the beam direction of the ribbon beam, and wherein the first bar is located at a first position in the second dimension and extends into the first dimension;

a first coil disposed on the first bar, wherein the first coil is the only coil disposed on the first bar, and wherein the first coil includes windings of electrical wire;

a second bar disposed opposite the first bar with a gap defined between the first bar and second bar, wherein the ribbon beam travels between the gap, and wherein the second bar is located at a second position in the second dimension and extends into the first dimension;

a second coil disposed on the second bar, wherein the second coil is the only coil disposed on the second bar, and wherein the second coil includes windings of electrical wire;

a third bar adjacent to the first bar, wherein the third bar is located at a third position in the second dimension and extends into the first dimension, and wherein the first position, the second position, and the third position are different;

a third coil disposed on the third bar, wherein the third coil is the only coil disposed on the third bar, wherein the third coil includes windings of electrical wire;

a fourth bar adjacent to the second bar;

a fourth coil disposed on the fourth bar, wherein the fourth coil is the only coil disposed on the fourth bar, wherein the fourth coil includes windings of electrical wire;

a first electrical power supply connected to the first coil without being electrically connected to any other coil;

a second electrical power supply connected to the second coil without being electrically connected to any other coil;

a third electrical power supply connected to the third coil without being electrically connected to any other coil; and a fourth electrical power supply connected to the fourth coil without being electrically connected to any other coil; and a target area disposed adjacent to the beam control assembly, the target area configured to position a work piece.

16. A method of controlling a ribbon beam of ions, the method comprising:

applying an electrical charge to a first coil using a first electrical power supply, wherein the first electrical power supply is connected to the first coil without being electrically connected to any other coil, wherein the first coil is disposed on a first bar, wherein the ribbon beam has a beam width and travels in a beam direction, wherein a first dimension corresponds to the beam width and a second dimension corresponds to the beam direction of the ribbon beam, wherein the first bar is located at a first position in the second dimension and extends into the first dimension, wherein the first coil is the only coil disposed on the first bar, and wherein the first coil includes windings of electrical wire;

applying an electrical charge to a second coil using a second electrical power supply, wherein the second electrical power supply is connected to the second coil without being electrically connected to another other coil, wherein the second coil is disposed on a second bar, wherein the second bar is located at a second position in the second dimension and extends into the first dimension, wherein the second coil is the only coil disposed on the second bar, wherein the second coil includes windings of electrical wire, wherein the second bar is disposed opposite the first bar with a first gap defined between the first bar and second bar, and wherein the ribbon beam travels between the first gap;

applying an electrical charge to a third coil using a third electrical power supply, wherein the third electrical power supply is connected to the third coil without being electrically connected to another other coil, wherein the third coil is disposed on a third bar, wherein the third bar is located at a third position in the second dimension and extends into the first dimension, wherein the first position, the second position, and the third position are different, wherein the third coil is the only coil disposed on the third bar, wherein the third coil includes windings of electrical wire, wherein the third bar is adjacent to the first bar, and wherein the ribbon beam travels between the gap; and applying an electrical charge to a fourth coil using a fourth electrical power supply, wherein the fourth electrical power supply is connected to the fourth coil without being electrically connected to another other coil, wherein the fourth coil is disposed on a fourth bar, wherein the fourth coil is the only coil disposed on the fourth bar, wherein the fourth coil includes windings of electrical wire, wherein the fourth bar is adjacent the second bar, wherein the fourth bar is disposed opposite the third bar with a second gap defined between the third bar and fourth bar, and wherein the ribbon beam travels between the second gap.

* * * * *